United States Patent
Hino (10) Patent No.: US 9,324,684 B2
(45) Date of Patent: Apr. 26, 2016

(54) SEMICONDUCTOR DEVICE AND MANUFACTURING METHOD THEREOF

(71) Applicant: Mitsubishi Electric Corporation, Tokyo (JP)

(72) Inventor: Yasunari Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/488,561

(22) Filed: Sep. 17, 2014

(65) Prior Publication Data

US 2015/0130085 A1    May 14, 2015

(30) Foreign Application Priority Data

Nov. 12, 2013   (JP) .................. 2013-233824

(51) Int. Cl.
*H01L 29/40* (2006.01)
*H01L 23/00* (2006.01)

(52) U.S. Cl.
CPC ................ *H01L 24/83* (2013.01); *H01L 24/29* (2013.01); *H01L 24/32* (2013.01); *H01L 24/45* (2013.01); *H01L 24/48* (2013.01); *H01L 24/73* (2013.01); *H01L 24/85* (2013.01); *H01L 2224/04042* (2013.01); *H01L 2224/29007*
(Continued)

(58) Field of Classification Search
CPC ......... H01L 24/29; H01L 24/33; H01L 24/40; H01L 24/83; H01L 24/91; H01L 24/27; H01B 1/08; H01B 1/02
USPC ............................................. 257/782; 438/612
See application file for complete search history.

(56) References Cited

U.S. PATENT DOCUMENTS

2004/0245648 A1    12/2004  Nagasawa et al.
2008/0160183 A1*    7/2008  Ide et al. ..................... 427/126.5
(Continued)

FOREIGN PATENT DOCUMENTS

JP    2004-107728 A    4/2004
JP    2006-228804 A    8/2006
(Continued)

OTHER PUBLICATIONS

An Office Action issued by the German Patent Office on Jul. 22, 2015, which corresponds to German Patent Application No. 10 2014 222 993.6 and is related to U.S. Appl. No. 14/488,561; with English language translation.

*Primary Examiner* — Trung Q Dang
(74) *Attorney, Agent, or Firm* — Studebaker & Brackett PC (57) ABSTRACT

A manufacturing method of a semiconductor device according to the present invention includes the steps of (a) preparing an insulating or conductive substrate; (b) arranging a bonding material having sinterability in at least one bonding region of a principal surface of the substrate (i.e., insulating substrate); and (c) sintering the bonding material while a bonding surface to be subjected to bonding of at least one semiconductor element is brought into pressurized contact with the bonding material, and bonding the substrate (i.e., insulating substrate) and the semiconductor element together through the bonding material. The bonding region in the step (b) is inwardly positioned from the bonding surface (i.e., region) of the semiconductor element in plan view, and the bonding material is not protruded outwardly from the bonding surface of the semiconductor element in plan view even after the step (c).

20 Claims, 2 Drawing Sheets (52) U.S. Cl.
CPC ........ (2013.01); *H01L 2224/29014* (2013.01); *H01L 2224/29339* (2013.01); *H01L 2224/29347* (2013.01); *H01L 2224/29364* (2013.01); *H01L 2224/32014* (2013.01); *H01L 2224/32055* (2013.01); *H01L 2224/32225* (2013.01); *H01L 2224/32245* (2013.01); *H01L 2224/45015* (2013.01); *H01L 2224/45124* (2013.01); *H01L 2224/48137* (2013.01); *H01L 2224/48472* (2013.01); *H01L 2224/73265* (2013.01); *H01L 2224/8384* (2013.01); *H01L 2224/83203* (2013.01); *H01L 2224/92247* (2013.01); *H01L 2924/13055* (2013.01); *H01L 2924/13091* (2013.01); *H01L 2924/15787* (2013.01); *H01L 2924/181* (2013.01); *H01L 2924/351* (2013.01)

(56) References Cited

U.S. PATENT DOCUMENTS

2008/0173398 A1* 7/2008 Yasuda et al. ................. 156/326
2009/0244868 A1* 10/2009 Morita et al. ................. 361/783

FOREIGN PATENT DOCUMENTS

| | | |
|---|---|---|
| JP | 2007-110001 A | 4/2007 |
| JP | 2007-188920 A | 7/2007 |

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and particularly relates to a method for bonding a semiconductor element.

2. Description of the Background Art

In view of stricter environmental regulations in recent years, a demand for environmentally friendly electronic devices (i.e., electronic devices corresponding to high quality, high efficiency, and energy saving) has been growing. Particularly, an electronic device corresponding to high power has been demanded as with industrial equipment, a drive control device for a home electric appliance provided with a motor, an in-vehicle control device for an electric vehicle and a hybrid vehicle, a control device for a railway vehicle, a control device for solar power generation, and the like. Further, high efficiency and low loss in the operation under a high-load environment (under a high-temperature environment) of electronic devices have been demanded. The high-temperature environment is an environment at a temperature of 150 to 175° C. or higher (e.g., 200° C.). Development of a semiconductor element which operates under the high-temperature environment has been progressing. Also, a high density in current has been promoted as a characteristic of a package.

Energy saving performance under a high-temperature environment has been demanded for an electronic device used, in particular, as an in-vehicle control device and a control device for a railway vehicle. The normal operating temperature has been, for example, 150° C. or lower. However, a demand for use under a high-temperature environment of 200° C. or higher is deemed to increase. Under a high-temperature environment of 200° C. or higher, SiC or GaN can well correspond, instead of Si, as a semiconductor element.

In view of this, it has been necessary to review materials and structures of electronic devices in order to suppress a switching loss and realize a low loss and high efficiency in operation under the high-temperature environment. Particularly, since a bonding portion inside a semiconductor device applied to an electronic device is most susceptible to deterioration, realizing high quality, high reliability, and long life of the bonding portion has been a large problem.

Then, to enhance high-temperature durability of the bonding portion, a bonding material having sinterability has been used instead of a solder material (e.g., see Japanese Patent Application Laid-Open No. 2004-107728). When a semiconductor element is bonded to a substrate with a bonding material having sinterability, the bonding material is sintered by pressurizing and at the same time heating the bonding material between a rear surface of the semiconductor element and a front surface of the substrate, and thus bonding is performed.

As described above, when the bonding is performed with the bonding material having sinterability, for example, the bonding material is pressurized between the rear surface of the semiconductor element and the front surface of the substrate in addition to heating. As a result, there has been a case where sintering is performed while the bonding material is protruded around the semiconductor element by pressurization. The protruded bonding material is sintered without being sufficiently pressurized. The bonding material which has been sintered while being protruded easily drops off because a fillet shape is not formed as in the case of the solder material. As a result, there has been such a problem that in a manufacturing step subsequent to a step for bonding the semiconductor element, the protruded bonding material drops off by vibrations or the like, which causes a trouble such as a short-circuit.

SUMMARY OF THE INVENTION

It is an object of the present invention to provide a semiconductor device in which high-temperature durability, quality, and reliability of a bonding portion that bonds a semiconductor element and a substrate together are improved by using a bonding material having sinterability, and a manufacturing method thereof.

The manufacturing method of the semiconductor device according to the present invention includes the steps of (a) preparing an insulating or conductive substrate; (b) arranging a bonding material having sinterability in at least one bonding region of a principal surface of the substrate; and (c) sintering the bonding material while a bonding surface to be subjected to bonding of at least one semiconductor element is brought into pressurized contact with the bonding material, and bonding the substrate and the semiconductor element together through the bonding material. The bonding region in the step (b) is inwardly positioned from the bonding surface of the semiconductor element in plan view, and the bonding material is not protruded outwardly from the bonding surface of the semiconductor element in plan view even after the step (c).

The bonding material is arranged inwardly in plan view from the bonding surface of the semiconductor element, and therefore it is possible to heat the bonding material while sufficiently applying pressure to the bonding material. In addition, since even after bonding, the bonding material does not protrude around the semiconductor element, such a case does not occur that the protruded bonding material drops off in a step subsequent to the bonding step (e.g., a step of wire bonding) or after completion of the semiconductor device. As a result, it is possible to obtain the semiconductor device having high quality and high reliability, in addition to the high-temperature durability obtained by using the bonding material having sinterability.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Configuration

Figure 1:
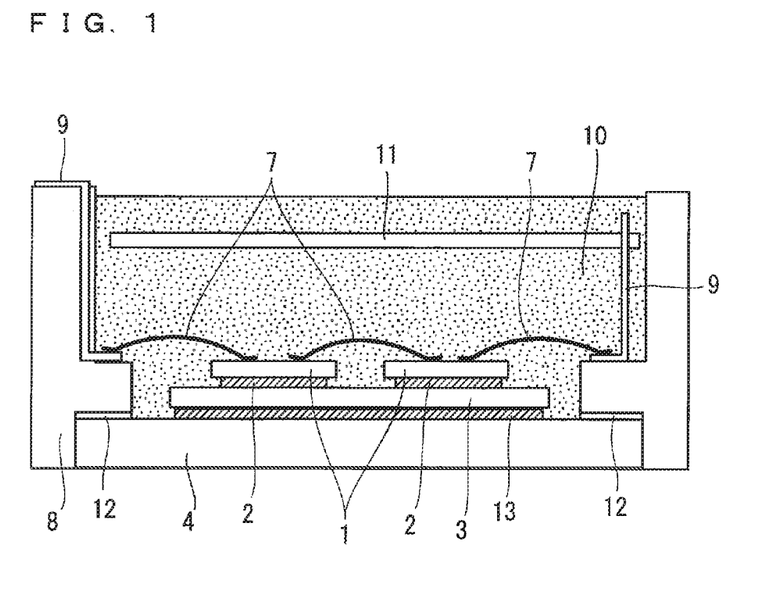
FIG. 1 is a cross sectional view of a semiconductor module including a semiconductor device according to a first preferred embodiment.

FIG. 1 illustrates a cross sectional view of a semiconductor module which includes a semiconductor device according to this preferred embodiment and which is applied to an electronic device used under a high-temperature environment. The semiconductor device according to this preferred embodiment includes an insulating substrate 3 which is a substrate having an insulating property, a semiconductor element 1 bonded to the insulating substrate 3, and a bonding material 2 having sinterability that bonds the insulating substrate 3 and the semiconductor element 1 together.

The insulating substrate 3 is bonded onto a heat dissipation plate 4 through solder 13 or a bonding material having sinterability. The insulating substrate 3 includes a circuit pattern on a surface thereof. The circuit pattern on the surface of the insulating substrate 3 and a back side electrode of the semiconductor element 1 are bonded together with the bonding material 2 having sinterability.

The heat dissipation plate 4 is fixed to a case 8 to serve as an outer hull of the semiconductor module with, for example, an adhesive 12. The case 8 encompasses peripheries of the insulating substrate 3, the semiconductor element 1, a wire 7, and a control board 11 which will be described later. The case 8 made of a resin is integrally formed with an electrode 9. An upper side electrode of the semiconductor element 1 and the electrode 9 are connected together with the wire 7. Further, the control board 11 having a drive circuit and a protective circuit mounted thereon is connected to the semiconductor element 1 through the electrode 9.

Further, by injecting a sealing material 10 into the case 8, the insulating substrate 3, the semiconductor element 1, the wire 7, and the control board 11 are sealed.

Hereinafter, each constituent will be described in details. Note that a size of each constituent described hereinafter is one example, and is not restricted to the described size. The heat dissipation plate 4 is for example a radiator plate having a side length of 50 to 300 mm, a thickness of 3 to 5 mm, and a large thermal capacity, and made of Cu, Al, or an Al—SiC composite. The heat dissipation plate 4 is bonded to the insulating substrate 3 through a bonding material having sinterability and a thickness of about 20 to 150 µm, or the solder 13 having a thickness of about 100 to 200 µm.

The insulating substrate 3 is formed of $Al_2O_3$, AlN, $Si_3N_4$, $ZrAl_2O_3$, or the like having a constant thickness of 0.2 to 3 mm. When a rear surface of the insulating substrate 3 and the heat dissipation plate 4 are bonded together with the solder 13, the rear surface of the insulating substrate 3 is treated with Ni plating having a thickness of 2 to 10 µm. Further, the circuit pattern is formed on a surface of the insulating substrate 3 (i.e., a surface on an upper side in FIG. 1) opposite to the heat dissipation plate 4. The surface on which the circuit pattern is formed is treated with a resist. The semiconductor element 1 is bonded to the circuit pattern formed on the upper surface of the insulating substrate 3 through the bonding material 2 having sinterability.

The semiconductor element 1 is, for example, a power semiconductor element, and is a semiconductor element such as an IGBT, MOSFET, or diode which deals with a large amount of power. The semiconductor element 1 forms, for example, a three-phase circuit so that an AC output is realized. Note that the semiconductor element 1 is not restricted to the IGBT, MOSFET, or diode made of Si, but may be made of SiC or GaN. For example, when the semiconductor element 1 is the IGBT, the back side electrode provided on a bottom surface of the semiconductor element 1 is a collector electrode, and upper side electrodes provided on a surface of the semiconductor element 1 are an emitter electrode and a gate electrode.

When the semiconductor element 1 forms a three-phase circuit, the semiconductor element 1 (for example, the diode, IGBT, or MOSFET) is, for each phase, is bonded to the circuit pattern on the insulating substrate 3 by wire bonding with the wire 7 made of aluminum or the like, and connected by wiring in the electronic device.

The case 8 is made of a resin such as PPS, PBT, or epoxy resin. The electrode 9 is an AC output terminal or an input/output terminal that performs output and input to and from outside, and is made of copper or a copper alloy having a thickness of about 1 mm. The electrode 9 is formed integrally with the case 8.

The electrode 9 on the right side in FIG. 1 is connected to the upper side electrode (e.g., gate electrode) of the semiconductor element 1 (e.g., IGBT) with the wire 7, and the electrode 9 is connected to the control board 11 having a drive circuit and a protective circuit mounted thereon, and receives an input of a control signal for performing switching. As illustrated in FIG. 1, the control board 11 is supported by the electrode 9 to be arranged above the insulating substrate 3 in a state substantially parallel to the insulating substrate 3.

The upper side electrode (emitter electrode) of the semiconductor element 1 (e.g., IGBT) is connected to an electrode of the semiconductor element 1 adjacent thereto with the wire 7. The electrode 9 on the left side in FIG. 1 is connected to a motor, a battery, and a harness outside the case 8 by wiring.

The sealing material 10 is an insulating gel material based on Si. Note that a lid (not illustrated) is fitted to the case 8 through an adhesive.

Note that in a bonding portion between each of the semiconductor elements 1 and the insulating substrate 3, the bonding material 2 is not protruded outwardly from a bonding surface to be subjected to bonding of the semiconductor element 1 in plan view. Note that in this preferred embodiment, the bonding surface to be subjected to bonding of the semiconductor element 1 is the bottom surface of the semiconductor element 1. Specifically, for example, the bottom surface of the semiconductor element 1 has one side of 4 mm to 18 mm, and the bonding material 2 is inwardly positioned with respect to each side of the bottom surface of the semiconductor element 1 by 30 to 200 µm. Note that it is preferable that an end of the bonding material 2 be positioned within 500 µm or less from each side of the bottom surface of the semiconductor element 1.

In this way, the fact that the bonding material 2 is not protruded outwardly from the bonding surface of the semiconductor element 1 in plan view means that the bonding material 2 has been sufficiently pressurized between the semiconductor element 1 and the insulating substrate 3 in a step of sintering the bonding material 2.

On the other hand, as described in the Description of the Background Art, when the bonding material 2 is protruded outwardly from the bonding surface of the semiconductor element 1 in plan view, this means that the protruded bonding material 2 has been sintered without sufficient pressurization. There has been such a possibility that the protruded portion drop off.

In the bonding portion between the semiconductor elements 1 and the insulating substrate 3, a thickness of the bonding material 2 after bonding becomes about 20 µm to 200 µm. In solder bonding, it has been necessary that a thickness of solder be 1000 µm or more in order to secure reliability of the bonding portion. On the other hand, when the bonding material 2 having sinterability is used, the reliability is not affected even when the thickness is 1000 µm or less.

Manufacturing Method

First, the bonding material 2 having sinterability according to this preferred embodiment will be described. The bonding material 2 in a paste form includes fine metallic particles, a solvent, and a surface stabilizer. The fine metallic particles are made of Ag, Cu, Au, Pd, Pt, or the like having a diameter of 1 nm or more and 10 μm or less. A surface of the fine metallic particle is covered with an organic protective film. By using the bonding material 2 including the fine metallic particles of nanosize or microsize, depression of the melting point is caused, and it is possible to perform sinter bonding at a temperature lower than a melting temperature specific to the bonding material. After the bonding, the melting point is increased to be comparable to that of a bulk material, and high heat resistance and reliability can be obtained.

When Ag is used for the fine metallic particles of the bonding material 2, the bonding material 2 is pressurized between the semiconductor element 1 and a conductive substrate 5 while being heated at a temperature of about 180° C. to 350° C. After the bonding, the bonding material 2 can secure heat resistance of about 900° C.

In the bonding material 2 in a paste form, since the metallic particles (e.g., Ag) are covered with the protective film, the particles do not bond to one another and are stable in the solvent. When the bonding material 2 is heated, the solvent (e.g., organic substance) vaporizes, and the metallic particles bond together. When the size of the metallic particles becomes at the nano-level, surface energy increases, and therefore such a sintering phenomenon occurs that the particles cohere and bond together at a temperature lower than a bulk melting point. Therefore, it is not necessary to heat the semiconductor element 1 and the insulating substrate 3 up to the bulk melting point during bonding, and it is possible to avoid thermal stress, strain, warpage, and the like caused thereby.

Figure 2:
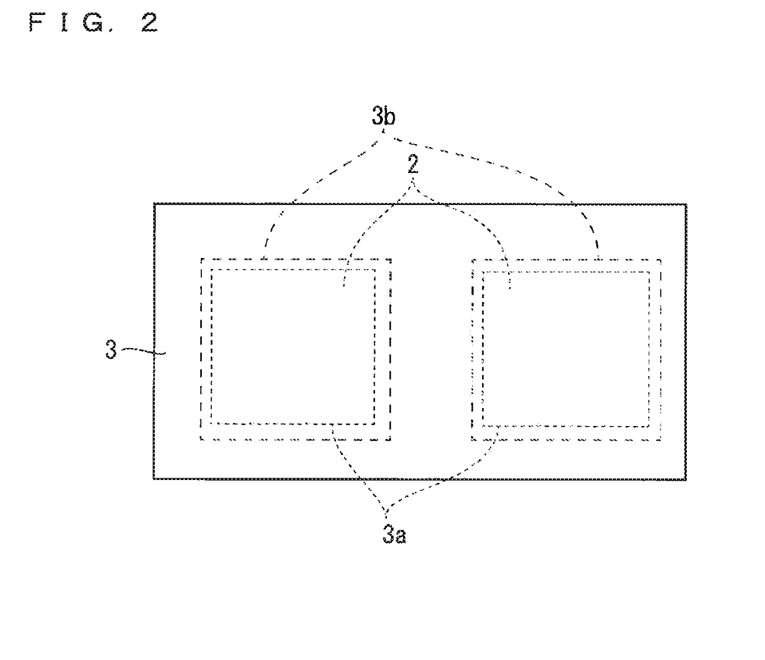
FIG. 2 is a plan view of an insulating substrate for explaining a manufacturing method of the semiconductor module according to the first preferred embodiment.

A manufacturing method of the semiconductor device according to this preferred embodiment will be described. First, the insulating substrate 3 is prepared. The circuit pattern is formed on an upper surface of the insulating substrate 3. FIG. 2 is a plan view of the insulating substrate 3. Next, the bonding material 2 in a paste form and having sinterability is arranged in a bonding region 3a of the circuit pattern on the upper surface of the insulating substrate 3. Namely, the bonding region 3a is a region in which the bonding material 2 is arranged. Printing is performed by, for example, screen printing. Note that that it is also possible to simultaneously print the bonding material 2 on a plurality of bonding regions 3a when the bonding material 2 is arranged on the insulating substrate 3. Further, it is possible to simultaneously perform printing on a plurality of insulating substrates 3 by arranging the plurality of insulating substrates 3 in a printing device and performing printing.

Next, the semiconductor element 1 is mounted on the bonding material 2. In FIG. 2, the region 3b is a region on which a bonding surface of the semiconductor element 1 is projected. Since the bonding surface of the semiconductor element 1 is the bottom surface of the semiconductor element 1 in this preferred embodiment, the semiconductor element 1 is mounted so that the bottom surface thereof overlaps the region 3b. Here, the bonding region 3a in which the bonding material 2 is arranged is inwardly positioned from the region 3b. Namely, the bonding material 2 is arranged inwardly from the region 3b in the step of arranging the bonding material 2 which is described above. Specifically, for example, each side of the bonding region 3a in which the bonding material 2 is arranged is inwardly positioned from each side of the region 3b by 30 to 200 μm.

Then, the bonding material 2 is sintered while the bonding surface of the semiconductor element 1 that has been mounted is brought into pressurized contact with the bonding material 2. The processing of pressurization and heating is performed by a hot press apparatus. The heating temperature is in a range of 180° C. to 350° C., a pressurizing force is in a range of 5 MPa to 30 MPa, and this state is kept for 30 to 180 seconds to perform bonding. By this pressurization and heating processing, the insulating substrate 3 and the semiconductor element 1 are bonded together through the bonding material 2. Note that in the step of performing the pressurization and heating processing by the hot press apparatus, the plurality of insulating substrates 3 may be collectively processed.

Note that the semiconductor element 1 is a MOSFET, an IGBT, a diode, or the like made by using a semiconductor such as SiC, GaN, or the like as a material. Each side of the bottom surface of the semiconductor element 1 is for example in a range of 4 to 18 mm.

Next, a lower surface of the insulating substrate 3 and the heat dissipation plate 4 are bonded together. The bonding is performed by solder bonding. Note that in the case where the lower surface of the insulating substrate 3 and the heat dissipation plate 4 are bonded together with the bonding material having sinterability, when the semiconductor element 1 and the insulating substrate 3 are bonded together, the insulating substrate 3 may be mounted on the heat dissipation plate 4 through the bonding material having sinterability in advance, and the bonding may be performed simultaneously by a hot press apparatus.

Next, the case 8 is fixed to the heat dissipation plate 4 with the adhesive 12. Then, the upper side electrodes of the semiconductor element 1, or the upper side electrodes of the semiconductor element 1 and the electrode 9 are connected together with the wire 7. Connection of the wire 7 is performed by wire bonding. Further, the control board 11 is connected to the electrode 9. Finally, the sealing material 10 is injected into the case so that the insulating substrate 3, the semiconductor element 1, the wire 7, and the control board 11 are sealed. Through these steps, the electronic device including the semiconductor device according to this preferred embodiment is produced.

As described above, in the manufacturing step of a semiconductor device according to this preferred embodiment, the bonding material 2 is arranged inwardly in plan view from the bonding surface of the semiconductor element 1, and then the bonding material 2 is heated and pressurized. As a result, it is possible to heat the bonding material 2 while applying sufficient pressure to the bonding material 2. In addition, since even after bonding, the bonding material 2 does not protrude around the semiconductor element 1, such a case does not occur that the protruded bonding material 2 drops off in a step subsequent to the bonding step (e.g., a step of wire bonding) or after completion of the semiconductor device. As a result, it is possible to obtain the semiconductor device having high quality and high reliability.

Note that since the melting point of the bonding material 2 after bonding is at a level comparable to that of a bulk material, when Ag is used as the bonding material 2, bonding is possible at a bonding temperature in a range of 180° C. to 350° C. Furthermore, it is possible to obtain high-temperature durability of about 900° C. after bonding. As a result, it is possible to obtain the semiconductor device having the improved high-temperature durability in addition to the high quality and high reliability.

Advantages

The manufacturing method of a semiconductor device according to this preferred embodiment includes the steps of (a) preparing an insulating or conductive substrate; (b) arranging a bonding material 2 having sinterability in at least one bonding region 3a of a principal surface of the substrate (i.e., insulating substrate 3); and (c) sintering the bonding material 2 while a bonding surface to be subjected to bonding of at least one semiconductor element 1 is brought into pressurized contact with the bonding material 2, and bonding the substrate (i.e., insulating substrate 3) and the semiconductor element 1 together through the bonding material 2. The bonding region 3a in the step (b) is inwardly positioned from the bonding surface (i.e., region 3b) of the semiconductor element 1 in plan view, and the bonding material 2 is not protruded outwardly from the bonding surface of the semiconductor element 1 in plan view even after the step (c).

Accordingly, in the step of arranging the bonding material 2 on an upper surface of the insulating substrate 3, the bonding material 2 is arranged inwardly in plan view from the bonding surface of the semiconductor element 1, and therefore it is possible to heat the bonding material 2 while applying sufficient pressure to the bonding material 2. In addition, since even after bonding, the bonding material 2 does not protrude around the semiconductor element 1, such a case does not occur that the protruded bonding material 2 drops off in a step subsequent to the bonding step (e.g., a step of wire bonding) or after completion of the semiconductor device. As a result, it is possible to obtain the semiconductor device having high quality and high reliability, in addition to the high-temperature durability obtained by using the bonding material 2 having sinterability.

Further, after the step (c) in the manufacturing method of the semiconductor device according to this preferred embodiment, the bonding material 2 is a conductive metal having any of Ag, Cu, Pd, and Au as a main component.

Therefore, by using the bonding material 2 including a conductive metal having any of Ag, Cu, Pd, and Au as a main component, it is possible to increase the heat resistant temperature of the bonding material 2 more than that of the solder material having Sn as a main component. In addition, by using Cu as the main component of the material for the bonding material 2, it is possible to reduce the material cost.

Furthermore, in the step (b) in the manufacturing method of the semiconductor device according to this preferred embodiment, the bonding material 2 includes metallic particles having a diameter of 1 nm or more and 10 μm or less.

Accordingly, by using fine metallic particles having a diameter of 1 nm or more and 10 μm or less as the bonding material 2, it is possible to perform sinter bonding at a temperature lower than a melting temperature specific to the bonding material. In addition, by using the bonding material 2 in which particles having a diameter of 1 nm or more and 10 μm or less are mixed together, it is possible to reduce the material cost.

Furthermore, in the step (b) in the manufacturing method of the semiconductor device according to this preferred embodiment, the bonding material 2 is in a paste form.

Accordingly, by using the bonding material 2 in a paste form, the bonding material 2 can be arranged by printing. By arranging the bonding material 2 by printing, the bonding material 2 can be collectively arranged in a plurality of regions, and therefore the productivity is increased.

Furthermore, in the step (b) in the manufacturing method of the semiconductor device according to this preferred embodiment, the bonding material 2 is arranged by printing.

Accordingly, by arranging the bonding material 2 by printing (e.g., screen printing), the bonding material 2 can be collectively arranged in a plurality of regions, and therefore the productivity is increased.

Furthermore, in the step (b) in the manufacturing method of the semiconductor device according to this preferred embodiment, as the bonding region 3a, a plurality of bonding region is provided, and, in the step (c), as the semiconductor element 1, a plurality of semiconductor elements is provided, and the semiconductor elements 1 are bonded in the bonding regions 3a, respectively.

Accordingly, the productivity is increased by collectively arranging the bonding material 2 in a paste form in the plurality of regions by printing, and further by mounting the plurality of semiconductor elements 1 in the regions respectively to perform a heating and pressurization processing, and performing bonding collectively.

Furthermore, after the step (c) in the manufacturing method of the semiconductor device according to this preferred embodiment, a thickness of the bonding material 2 that has been sintered is 1000 μm or less.

As a result, although a bonding thickness of 1000 μm or more has been necessary in the solder material in general, the bonding thickness can be made 1000 μm or less by performing the bonding using the bonding material 2 according to this preferred embodiment. When the bonding thickness is made smaller, an entire thickness of the semiconductor device can be made smaller. Further, when the bonding thickness is made smaller, an amount of using the bonding material 2 can be reduced, and therefore the material cost can be reduced.

Further, the semiconductor device according to this preferred embodiment includes an insulating or conductive substrate; a semiconductor element 1 bonded to a surface of the substrate (i.e., insulating substrate 3); and a bonding material 2 having sinterability that bonds the substrate and a bonding surface to be subjected to bonding of the semiconductor element 1 together. The bonding material 2 is the material sintered while the bonding surface of the semiconductor element 1 is brought into pressurized contact with the bonding material 2, and the bonding material 2 is not protruded outwardly from the bonding surface of the semiconductor element 1 in plan view.

Accordingly, since the sintered bonding material 2 is not protruded around the semiconductor element 1, such a case does not occur that the protruded bonding material 2 drops off and causes a short-circuit of wiring. As a result, it is possible to improve the quality and reliability of the semiconductor device.

Second Preferred Embodiment

Configuration

Figure 3:
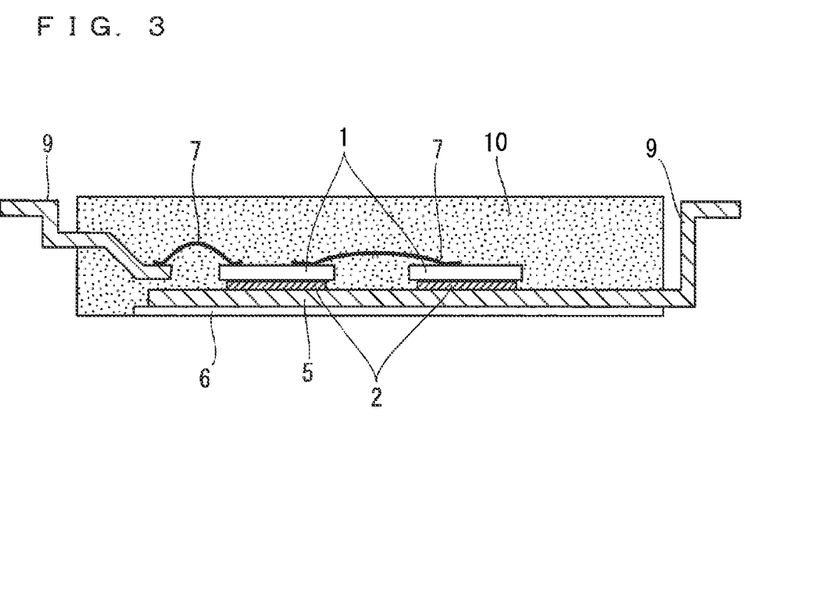
FIG. 3 is a cross sectional view of a semiconductor module including a semiconductor device according to a second preferred embodiment.

FIG. 3 illustrates a cross sectional view of a semiconductor module which includes a semiconductor device according to this preferred embodiment and which is applied to an electronic device used under a high-temperature environment. The semiconductor device according to this preferred embodiment includes an conductive substrate 5, a semiconductor element 1 bonded to the conductive substrate 5, and a bonding material 2 having sinterability that bonds the conductive substrate 5 and the semiconductor element 1 together. Note that the conductive substrate 5 is a metallic plate.

A rear surface (i.e., a surface opposite to a surface to be bonded to the semiconductor element 1) of the conductive substrate 5 is adhering to an insulating metallic layer 6 having insulating foil on a bottom surface thereof.

As illustrated in FIG. 3, an electrode 9 is provided at one end of the conductive substrate 5. In addition, an electrode 9 on the other end side of the conductive substrate 5 is connected to an upper side electrode of the semiconductor element 1 with a wire 7.

The conductive substrate 5, the semiconductor element 1, the bonding material 2, the insulating metallic layer 6, and the wire 7 are sealed by a sealing material 10 including an epoxy resin as a main component. Note that a part of the bottom surface of the insulating metallic layer 6 and the electrode 9 is exposed outside the sealing material 10. Note that the electrode 9 is externally connected to a motor, a battery, and a harness by wiring. Hereinafter, each constituent will be described in details.

In the semiconductor device according to this preferred embodiment, for example, a pair of an IGBT and a diode, as the semiconductor element 1, is bonded to the conductive substrate 5. The IGBT as the semiconductor element 1 has a collector electrode as a back side electrode, and a gate electrode and an emitter electrode as upper side electrodes. In the IGBT, input from outside (switching on/off control) and external control are made by means of the electrodes 9. Note that the semiconductor element 1 is not restricted to the IGBT, but a MOSFET, a transistor, or the like may be used. Further, the semiconductor element 1 is not restricted to those that use Si as a material, but may be a MOSFET, a diode, or the like that uses SiC or GaN as a material, for example. Note that the upper side electrode and the back side electrode of the semiconductor element 1 are treated with metallization using Ti—Ni—Au or Ag.

The back side electrode (e.g., collector electrode) of the semiconductor element 1 and the conductive substrate 5 are electrically connected together with the bonding material 2. The conductive substrate 5 is a metallic plate made of copper or a copper alloy having thermal conductivity as large as about 400 W/(m. K), and having electric resistance as small as about 2 $\mu\Omega\cdot$cm. The conductive substrate 5 has a thickness of about 3 to 5 mm, and has a function as a radiator plate.

One end of the conductive substrate 5 extends outside the sealing material 10 and is formed as the electrode 9. The semiconductor element 1 such as the MOSFET or IGBT described above has a large heat value in order to perform switching control of a large current. Therefore, it is necessary to provide the conductive substrate 5 that functions as the radiator plate having such high thermal conductivity.

The insulating metallic layer 6 adhering to the rear surface of the conductive substrate 5 has a laminated structure of an insulating layer and a protective metallic layer. An epoxy resin mixed with a filler such as boron nitride or alumina is used for the insulating layer. The protective metallic layer made of copper, alumina, or the like having high thermal conductivity is adhering to the insulating layer. Further, although not illustrated in FIG. 3, a heat dissipation plate, a heat sink provided with a plurality of fins, water-cooled fins, or the like is connected to the insulating metallic layer 6.

Heat generated by operation of the semiconductor element 1 is transferred through the conductive substrate 5 and the insulating metallic layer 6, and further dissipated outside, for example, through a radiator plate (not illustrated) connected to the insulating metallic layer 6. In this way, increase in temperature of the semiconductor element 1 is suppressed.

Note that although the semiconductor device according to this preferred embodiment includes the insulating metallic layer 6, such a configuration may be adopted that the insulating metallic layer 6 is not provided and the rear surface of the conductive substrate 5 is exposed. Furthermore, such a configuration may be adopted that the insulating substrate 3 (e.g., a ceramic substrate made of aluminum nitride) described in the first preferred embodiment is provided instead of the conductive substrate 5 and the insulating metallic layer 6.

The upper side electrode (gate electrode) of the semiconductor element 1 as the IGBT is connected to the electrode 9 with the wire 7, and the other upper electrode (emitter electrode) of the semiconductor element 1 is connected to the upper side electrode of the semiconductor element 1 as the diode which is arranged adjacent thereto through the wire 7. The back side electrode (collector electrode) of the semiconductor element 1 is electrically connected to an external terminal through the conductive substrate 5 and the electrode 9.

The electrode 9 is formed by bending a flat plate with die. The flat plate has a thickness of about 0.5 to 2 mm and the flat plate is made of copper or a copper alloy. Generally, wiring connection from a surface of the semiconductor element 1 to an external electrode is made by wire bonding using the wire 7 made of a metal such as aluminum and by solid phase bonding. The semiconductor device according to this preferred embodiment is assumed to perform switching control of a large current and allow a large current to flow as operating current. Therefore, the plurality of wires 7 is arranged in parallel, and a thick metallic wire having a diameter of about 300 to 500 µm is used as the wire 7.

Further, as with the first preferred embodiment, in a bonding portion between each of the semiconductor elements 1 and the conductive substrate 5, the bonding material 2 is not protruded outwardly from a bonding surface to be subjected to bonding of the semiconductor element 1 in a plan view. Note that in this preferred embodiment, the bonding surface to be subjected to bonding of the semiconductor element 1 is a bottom surface of the semiconductor element 1. Specifically, for example, one side of the bottom surface of the semiconductor element 1 is 4 mm to 18 mm.

Manufacturing Method

Figure 4:
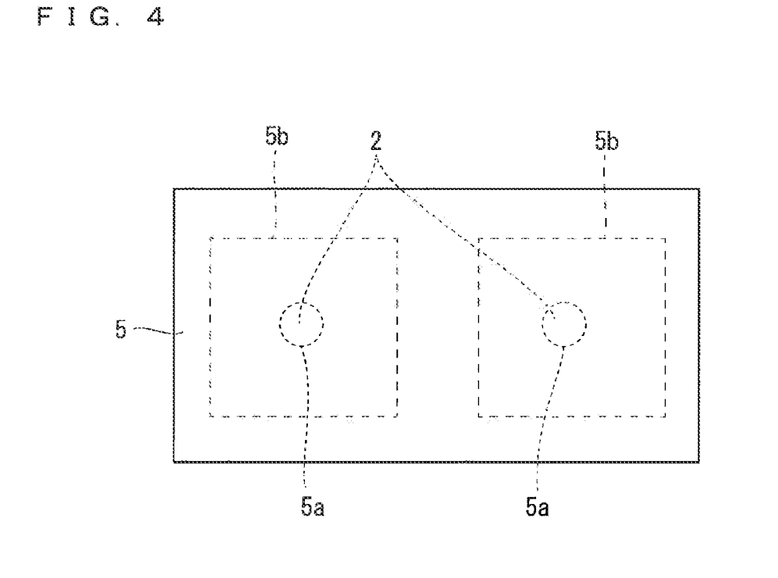
FIG. 4 is a plan view of an insulating substrate for explaining a manufacturing method of the semiconductor module according to the second preferred embodiment.

First, the conductive substrate 5 having a size of 10 mm×80 mm×3 mm is prepared. FIG. 4 is a plan view of the conductive substrate 5. Next, the bonding material 2 in a paste form and having sinterability is arranged in a bonding region 5a on an upper surface of the conductive substrate 5. The bonding material 2 has the same nature as that of the bonding material described in the first preferred embodiment. A syringe is filled with the bonding material 2, and the bonding material 2 is ejected from the syringe to coat the bonding region 5a. Namely, the bonding region 5a is a region in which the bonding material 2 is arranged. In FIG. 4, a region 5b is a region on which a bonding surface (the bottom surface of the semiconductor element 1 in this preferred embodiment) of the semiconductor element 1 is projected. The bonding material 2 is arranged in a center of the region 5b.

Next, the semiconductor element 1 is mounted on the conductive substrate 5 so that the bottom surface of the semiconductor element 1 overlaps the region 5b. Here, the bonding region 5a in which the bonding material 2 is arranged is inwardly positioned from the region 5b. Namely, the bonding material 2 is arranged inwardly from the region 5b in the step of arranging the bonding material 2 which is described above.

The bonding material 2 is then sintered while the bonding surface of the semiconductor element 1 that has been mounted is brought into pressurized contact with the bonding material 2. The processing of pressurization and heating is performed by a hot press apparatus. The heating temperature is in a range of 180° C. to 350° C., a pressurizing force is in a range of 5 MPa to 30 MPa, and this state is kept for 30 to 180 seconds to perform bonding. By this processing of pressurization and heating, the insulating substrate 3 and the semiconductor element 1 are bonded together through the bonding material 2. Note that in the step for performing the heating and pressurization processing by the hot press apparatus, a plurality of conductive substrates 5 may be processed collectively.

During pressurization, the bonding material 2 in a paste form spreads from coating location (bonding region 5a) as a center between the bottom surface of the semiconductor element 1 and the conductive substrate 5 with a coating location (bonding region 5a) as a center. Note that a coating amount of the bonding material 2 is a coating amount with which the bonding material 2 does not protrude from the bottom surface (i.e., region 5b) of the semiconductor element 1 during the pressurization. A thickness of the bonding material after the bonding, i.e., after heating and pressurization, is about 20 to 200 mm.

As described above, the two semiconductor elements 1 illustrated in FIG. 3 can be simultaneously bonded by the hot press apparatus. Not only two but also a plurality of semiconductor elements 1 can be collectively heated and pressurized, and simultaneously bonded together, which is excellent in productivity.

Next, the upper side electrode of the semiconductor element 1 and an upper side electrode of another semiconductor element 1, or the upper side electrode of the semiconductor element 1 and the electrode 9 are connected together by wiring with the wire 7 made of Al, for example, by wedge bonding.

Then, finally, the conductive substrate 5, the semiconductor element 1, the bonding material 2, and the wire 7 are sealed by the sealing material 10 having the epoxy resin as a main component through a transfer molding method. In this case, the insulating metallic layer 6 adheres to the conductive substrate 5.

By the manufacturing method according to this preferred embodiment, it is possible to perform the bonding at a temperature (180° C. to 350° C.) lower than a melting-point temperature of the bulk material, and obtain high-quality bonding having heat resistance up to the melting point of the bulk material. As a result, it is possible to obtain a semiconductor device that can operate at a high temperature and has high reliability.

Advantages

In the step of arranging a bonding material 2 having sinterability in a bonding region 5a of a principal surface of the substrate (i.e., conductive substrate 5) in the manufacturing method of the semiconductor device according to this preferred embodiment, the bonding material 2 is arranged by being ejected from a syringe.

Accordingly, when the bonding is performed, the semiconductor element 1 is heated while the conductive substrate 5 is pressurized. Therefore, by arranging the bonding material 2 in a center of a region in which the semiconductor element 1 is arranged, the bonding material 2 is pressurized and spreads substantially in a concentric manner. For this reason, even when the bonding material 2 is arranged using syringe, it is possible to perform the bonding.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a semiconductor device, comprising the steps of:
    (a) preparing an insulating or conductive substrate and at least one semiconductor element having an electrode on one side thereof as a bonding surface of the semiconductor element;
    (b) arranging a bonding material having sinterability in at least one bonding region of a principal surface of said substrate; and
    (c) sintering said bonding material while said bonding surface of said semiconductor element is brought into pressurized contact with said bonding material, to bond said substrate and said semiconductor element, wherein said bonding surface has an outer edge, and said bonding material is inwardly positioned from the outer edge of the bonding surface of said semiconductor element in plan view even after said step (c).

2. The manufacturing method of a semiconductor device according to claim 1,
    wherein, after said step (c), said bonding material is a conductive metal having any of Ag, Cu, Pd, and Au as a main component.

3. The manufacturing method of a semiconductor device according to claim 1,
    wherein, in said step (b), said bonding material comprises metallic particles having a diameter of 1 nm or more and 10 μm or less.

4. The manufacturing method of a semiconductor device according to claim 1,
    wherein, in said step (b), said bonding material is in a paste form.

5. The manufacturing method of a semiconductor device according to claim 1,
    wherein, in said step (b), said bonding material is arranged by printing.

6. The manufacturing method of a semiconductor device according to claim 1,
    wherein, in said step (b), said bonding material is arranged by being ejected from a syringe.

7. The manufacturing method of a semiconductor device according to claim 4,
    wherein, in said step (b), as said bonding region, a plurality of bonding regions is provided, and
    in said step (c), as said semiconductor element, a plurality of semiconductor elements is provided, and said semiconductor elements are bonded in said bonding regions, respectively.

8. The manufacturing method of a semiconductor device according to claim 5,
    wherein, in said step (b), as said bonding region, a plurality of bonding regions is provided, and
    in said step (c), as said semiconductor element, a plurality of semiconductor elements is provided, and said semiconductor elements are bonded in said bonding regions, respectively.

9. The manufacturing method of a semiconductor device according to claim 6,
    wherein, in said step (b), as said bonding region, a plurality of bonding regions is provided, and
    in said step (c), as said semiconductor element, a plurality of semiconductor elements is provided, and said semiconductor elements are bonded in said bonding regions, respectively.

10. The manufacturing method of a semiconductor device according to claim 1,
    wherein, after said step (c), a thickness of said bonding material that has been sintered is 1000 μm or less.

11. A semiconductor device comprising:
    an insulating or conductive substrate;
    a semiconductor element including an electrode on one side thereof as a bonding surface of the semiconductor element, said electrode pressure bonded to a surface of said substrate; and
    a bonding material having sinterability that forms said bond of said substrate and said semiconductor element, wherein
    said bonding surface has an outer edge, and said bonding material is inwardly positioned from said outer edge of said bonding surface of said semiconductor element in plan view after said pressure bonding.

12. The manufacturing method of a semiconductor device according to claim 1,
wherein said semiconductor element includes an upper side electrode, and the method further comprises connecting a wire to said upper side electrode of said semiconductor element.

13. The manufacturing method of a semiconductor device according to claim 12,
wherein said upper side electrode is on a side of said semiconductor element opposite to said one side.

14. The semiconductor device according to claim 11,
wherein said semiconductor element comprises an upper side electrode, and said semiconductor device comprises a wire connected to said upper side electrode of said semiconductor element.

15. The semiconductor device according to claim 14,
wherein said upper side electrode is on a side of said semiconductor element opposite to said one side.

16. The manufacturing method of a semiconductor device according to claim 1,
wherein in said step (c) said bonding material spreads outwardly from said bonding region.

17. The manufacturing method of a semiconductor device according to claim 1,
wherein said substrate comprises a bonding surface having an outer edge, and
said bonding material is inwardly positioned from said outer edge of said bonding surface of said substrate in plan view even after said step (c).

18. The semiconductor device according to claim 11,
wherein said substrate comprises a bonding surface having an outer edge, and
said bonding material is inwardly positioned from said outer edge of said bonding surface of said substrate in plan view.

19. The manufacturing method of a semiconductor device according to claim 1,
wherein said outer edge extends along an entire periphery of said bonding surface, and
said bonding material is inwardly positioned from said entire periphery of said bonding surface.

20. The semiconductor device according to claim 11,
wherein said outer edge extends along an entire periphery of said bonding surface, and
said bonding material is inwardly positioned from said entire periphery of said bonding surface.

* * * * *